United States Patent [19]

Herklotz et al.

[11] Patent Number: 4,798,663
[45] Date of Patent: Jan. 17, 1989

[54] SPUTTERING INSTALLATION FOR THE REACTIVE COATING OF A SUBSTRATE WITH HARD MATERIALS

[75] Inventors: Günther Herklotz, Bruchköbel; Hans Eligehausen, Hanau, both of Fed. Rep. of Germany

[73] Assignee: Leybold-Heraeus GmbH, Cologne, Fed. Rep. of Germany

[21] Appl. No.: 927,671

[22] PCT Filed: Jan. 31, 1986

[86] PCT No.: PCT/EP86/00045
 § 371 Date: Sep. 30, 1986
 § 102(e) Date: Sep. 30, 1986

[87] PCT Pub. No.: WO86/04616
 PCT Pub. Date: Aug. 14, 1986

[30] Foreign Application Priority Data

Feb. 1, 1985 [DE] Fed. Rep. of Germany ....... 3503398

[51] Int. Cl.$^4$ .............................................. C23C 14/34
[52] U.S. Cl. ................................ 204/298; 204/192.12
[58] Field of Search ..................... 204/298, 164, 192.1, 204/192.12, 192.15

[56] References Cited

U.S. PATENT DOCUMENTS

| | | | |
|---|---|---|---|
| 3,516,919 | 6/1970 | Gaydou et al. | 204/298 |
| 3,844,924 | 10/1974 | Cunningham et al. | 204/298 |
| 3,892,650 | 7/1975 | Cusmo et al. | 204/298 X |
| 4,038,171 | 7/1977 | Moss et al. | 204/298 |
| 4,046,666 | 9/1977 | McClanaham et al. | 204/298 |
| 4,111,783 | 9/1978 | Bindell et al. | 204/298 |
| 4,221,652 | 9/1980 | Kuriyama | 204/298 |
| 4,252,626 | 2/1981 | Wright et al. | 204/298 X |
| 4,389,299 | 6/1983 | Adachi et al. | 204/298 |
| 4,411,763 | 10/1983 | Itaba et al. | 204/298 |
| 4,422,916 | 12/1983 | McKelvey | 204/298 X |

FOREIGN PATENT DOCUMENTS

| | | |
|---|---|---|
| 1515294 | 8/1969 | Fed. Rep. of Germany . |
| 2096177 | 10/1982 | United Kingdom . |

Primary Examiner—John F. Niebling
Assistant Examiner—Nam X. Nguyen
Attorney, Agent, or Firm—Felfe & Lynch

[57] ABSTRACT

Sputtering apparatus for the reactive coating of substrates with hard substances, which has a housing (1) with a feed line (3, 4) for a reaction gas a nobble gas, a magnetron (6) as well as at least one mounting (9) for the substrates, the mounting (9) being positionable in front of the sputtering surface and between an ionization system with at least two electrodes (7, 8), of which the one electrode (8) is operable as an electron emitter and the other electrode (7) is at a positive potential with respect to the emitter electrode, and the substrate mounting (9) itself is at a negative voltage in relation to the ground.

13 Claims, 4 Drawing Sheets

SPUTTERING INSTALLATION FOR THE REACTIVE COATING OF A SUBSTRATE WITH HARD MATERIALS

STATE OF THE ART

The invention relates to a sputtering apparatus for the reactive coating of substrates with hard substances, especially with titanium nitride or titanium carbide, which has an evacuable housing at ground potential with a feed line for a reaction gas and a noble gas, and in which the sputtering surface of a magnetron serving as the sputtering unit plus at least one mounting for the substrates are disposed, the substrates being positionable in front of the sputtering surface by means of the mounting.

Such sputtering apparatus, in which a so-called high-power cathode sputtering is performed, are disclosed, for example, in the offprint 11-S01 entitled, "Herstellung von harten Titan-Nitrid-Schichten mittels Hochleistungskatodenzerstaeubung" (also published in "Werkstoffe und ihre Veredlung", vol 3, 1981, by W. D Muenz and G. Hessberger) of Leybold-Heraeus GmbH, and by DE-OS No. 31 07 914, in which the basic construction and the manner of operation of a magnetron cathode ("magnetron") are described.

With sputtering apparatus of this kind, tools for machining, such as drills and mills, for example, as well as tool parts, are covered with wear-resistant coatings in order to lengthen the cutting edge life of the tools in comparison with an uncoated tool. High-power cathode sputtering is characterized by the fact that a high sputtering and deposition rate can be established, and that furthermore the process parameters can be maintained precisely and repeatably. In the case of a relative movement between the substrate and the magnetron cathode, even large areas can be uniformly coated. The quality of the coated substrates depends on parameters such as substrate bias voltage, substrate current, operating pressure, operating temperature, the geometric conditions of the sputtering apparatus, and on the field strength of the magnetic field and its configuration.

In the known system, the substrate coating is performed by two symmetrically arranged magnetron cathodes between which the substrates are continuously moved by means of a rotating substrate holding means, a so-called "cage", without the need for an additional rotatory movement with respect to the cage.

The known system requires a careful adjustment of all influencing magnitudes, and necessitates complex changeover work if substrates of different dimensions, especially transverse dimensions are to be coated in succession. For example, it is not easily possible to coat slender drills and protruding cutterheads in one and the same batch. But it is not possible, or not easily possible, even to increase the free distance between the two magnetron cathodes to permit passage of wider substrates. Precisely in small production operations, however, it is often necessary to coat batches which consist of different substrates. If the fit between the magnetron cathodes and the substrates is poor, however, the quality of the coating is not assured for all substrate dimensions.

THE PROBLEM

The present invention is addressed to the problem of creating a sputtering apparatus of the kind described in the beginning, which will also be suitable for substrates of different sizes, so that a substantial increase of tool edge life will be achieved in all substrates.

THE INVENTION

The solution of the stated problem is accomplished in accordance with the invention, in the sputtering apparatus described in the beginning, by the fact that the mounting for the substrates is disposed between an ionizing system having at least two electrodes, one electrode of which can be operated as an electron emitter and the other electrode is at a positive potential with respect to the emitter electrode, and wherein the substrate mounting itself is at a negative voltage with respect to ground.

ADVANTAGES

In the sputtering apparatus according to the invention the plasma density is substantially increased by controlled electron inclusion. Substrate currents above 5 mA per square centimeter can be achieved. With such bias currents virtually structureless coatings and better strengths of adhesion are achieved, even when the individual surface elements of the substrates are at different distances from the sputtering surface. The sputtering rate is not reduced in this case.

Especially good coating results have been achieved with a sputtering apparatus in which the at least one positive electrode is on the side of the substrate mounting that faces the magnetron. Such an electrode is at the same time an anode with respect to the magnetron. It is consequently especially advantageous for the at least one positive electrode to be immediately adjacent to the magnetron.

An additional increase of the bias current by about 30% can be achieved if at least one magnet system which lengthens the path of the electrons emitted by the emitter electrode is disposed in the housing.

The magnet system in this case should be disposed in an area opposite the sputtering surface of the magnetron, and the substrate and the electrodes should be disposed between the sputtering surface and the magnet system.

The magnet system consists, in an especially advantageous manner, of magnets of opposite polarity lying one inside the other such that a closed tunnel of arcuate magnetic lines of force issues from the magnets. The magnet system consequently resembles magnet systems such as those used in the magnetron cathodes. It does not, however, have any source for the coating material, i.e., it has no so-called target.

Further advantages and details of the sputtering apparatus according to the invention will be seen in the description that follows of two embodiments.

DETAILED DESCRIPTION

Figure 1:
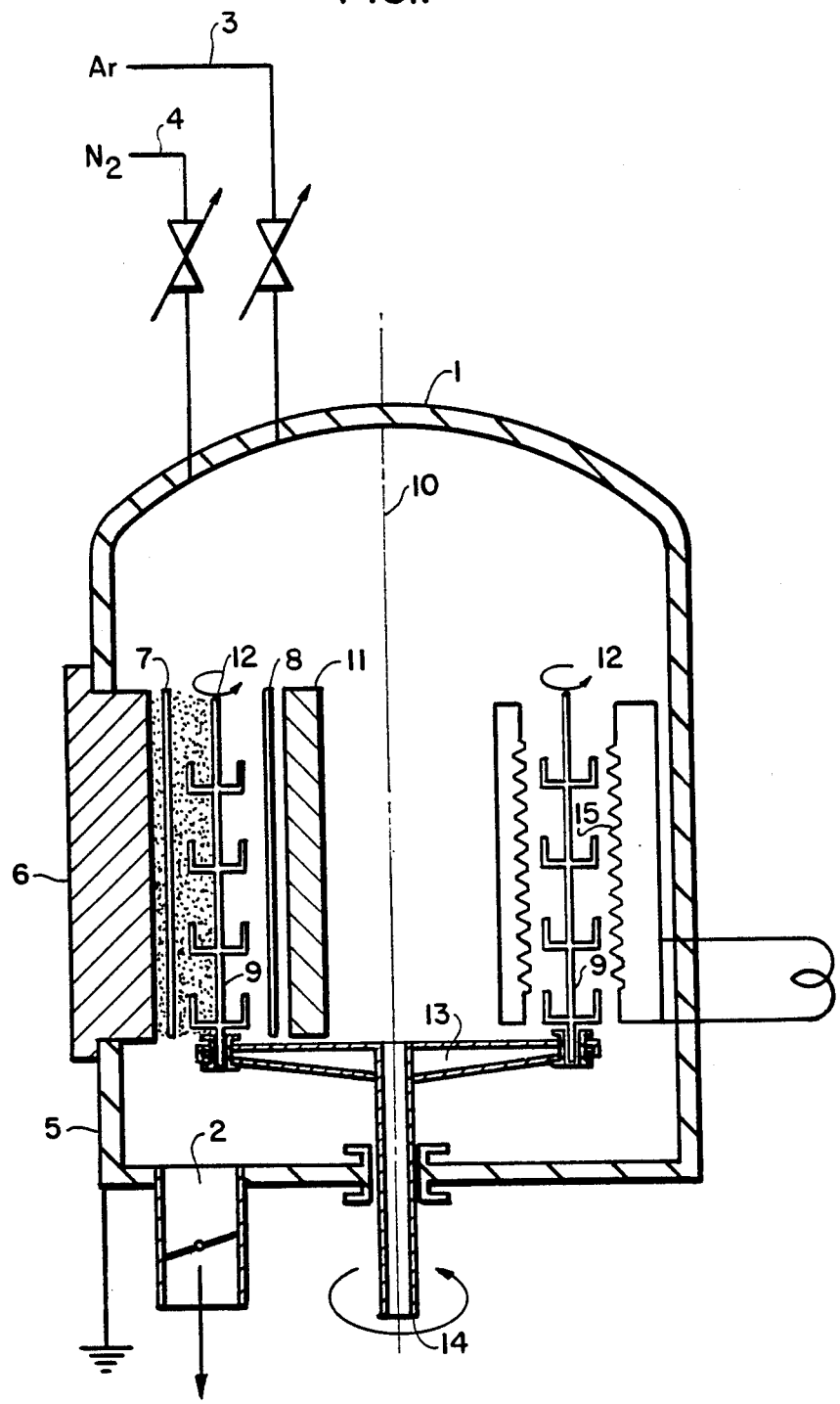
FIG. 1 shows a vertical section through a complete sputtering apparatus represented diagrammatically.

The sputtering apparatus according to FIG. 1 has a vacuum-tight, grounded housing 1 which can be evacuated through a connection 2 situated in its bottom area. Through the feed lines 3 and 4 in the top area of the housing 1, an inert gas, argon, for example, and/or a reaction gas, nitrogen, for example, can be introduced selectively into the housing 1. In the side wall 5 of the housing there is inserted a magnetron 6 (a so-called high-power sputtering cathode), to which polycrystalline titanium metal, for example, is bonded as the target.

Directly adjacent the magnetron 6 there is disposed in the housing 1 an ionizing system having two electrodes 7 and 8, between which a substrate mounting 9, on which the substrates (not shown) are fastened, can be passed through on a circular path.

Of the two electrodes 7 and 8 of the ionizing system, the electrode 7 that is nearer to the magnetron 6 is at positive voltage, while the emitter electrode is the electrode 8 facing away from the magnetron. The electrodes are preferably one or two bars of a refractory metal such as tungsten. In back of the emitter electrode 8 (looking from the magnetron 6 toward the housing axis 10) there is disposed a magnet system 11 which produces the above-described increase of the bias current by as much as 30%.

The substrate mountings 9 are each journaled for rotation about an axis 12, so that an all-around, uniform coating of the substrates can be achieved in the area of the ionization system and the magnetron. A great number of such substrate mountings 9 are fastened to a horizontal carrier means 13 which can be rotated about the housing axis 10 by means of a drive shaft 14 coaxial therewith.

In the housing area opposite the ionization system there is disposed a heating station 15 past which the substrate mountings 9 are carried with the substrates when the carrier means 13 rotates about the housing axis 10, so as to heat them prior to the coating.

Figure 2:
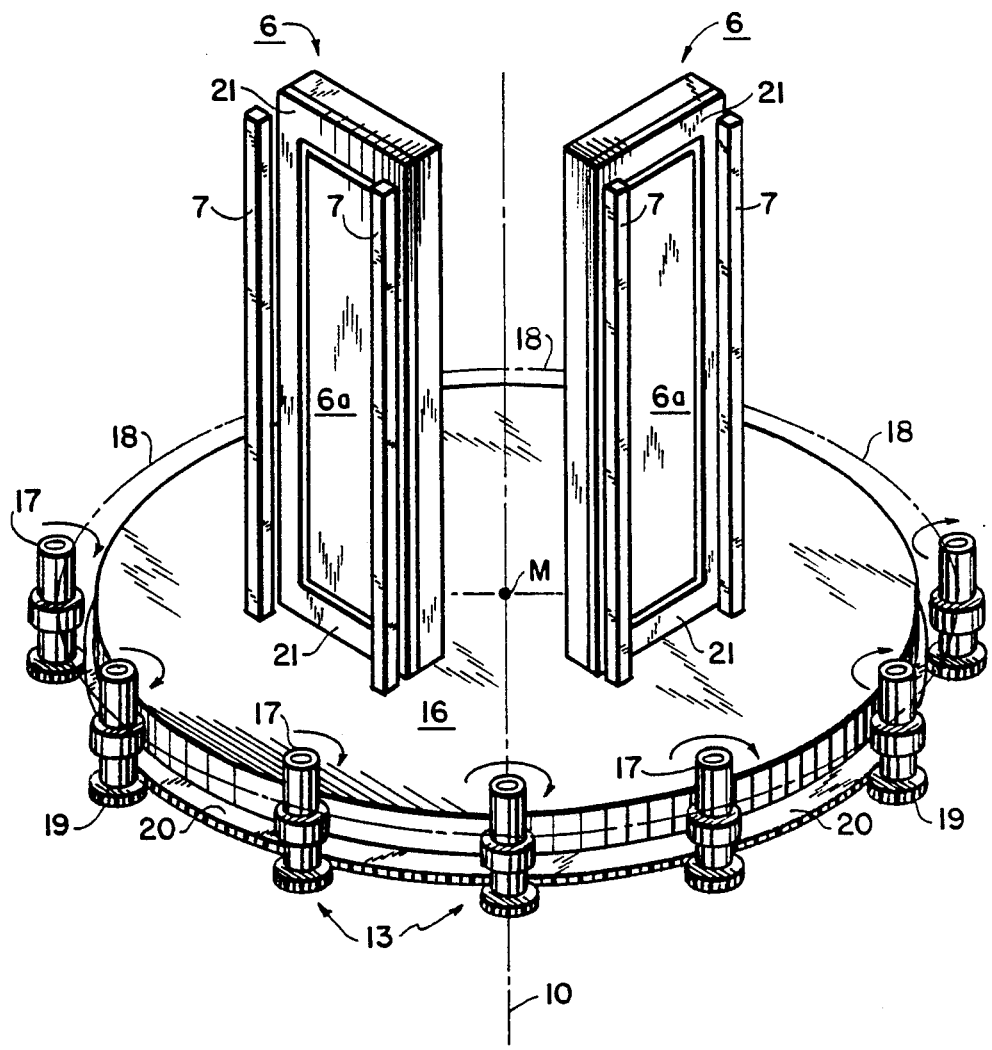
FIG. 2 is a perspective view of a portion of a variant of FIG. 2 with two internally placed magnetrons with which two positive electrodes are directly associated in pairs.

FIG. 2 shows the inverse construction (in comparison to the viewing direction in FIG. 1), i.e., two magnetrons 6 are disposed in the interior of the housing 1 (here not shown), in such a manner that a normal through the center of each sputtering surface 6a runs in the radial direction to the housing axis 10. The two magnetrons 6 are disposed—in an insulated manner—on a circular, stationary support plate 16. About the housing axis 10 passing through its center M rotates the support means 13 which includes a driven ring, here not shown, on which a number of pivot bearings 17 are fastened, whose axes of rotation perform a circulatory movement along the path of movement 18, indicated by the broken line, which is a circular path with the center M. For the driving of the pivot bearings 17, each of the latter has at its bottom end a gear 19 which rolls on an annular rack 20 fastened stationarily to the support plate 16. Thus the pivot bearings 17 perform a composite movement, namely a circular movement about the center M and a rotatory movement on their own axes of rotation in the direction of the arrows shown in the drawing. One substrate mounting 9 in accordance with FIG. 1 can be inserted into each of the pivot bearings 17, so that the substrates fastened thereon can be carried past the sputtering surfaces 6a of the magnetron 6 and become coated on all sides due to their additional self-rotation.

It is here shown that the magnetrons 6 are surrounded on their periphery each by a frame 21 of a magnetizable material (e.g., iron). By this measure flashovers, which can occasionally occur in operation, are prevented.

It is furthermore shown that the magnetrons 6 have each a rectangular sputtering surface 6a, and that the positive electrodes 7, present in pairs, are arranged one on each side of the magnetrons 6, directly adjacent the two longest edges of the sputtering surface. The electrodes 7 can be at ground potential, but they can also be at a more positive potential with respect to the ground.

Figure 3:
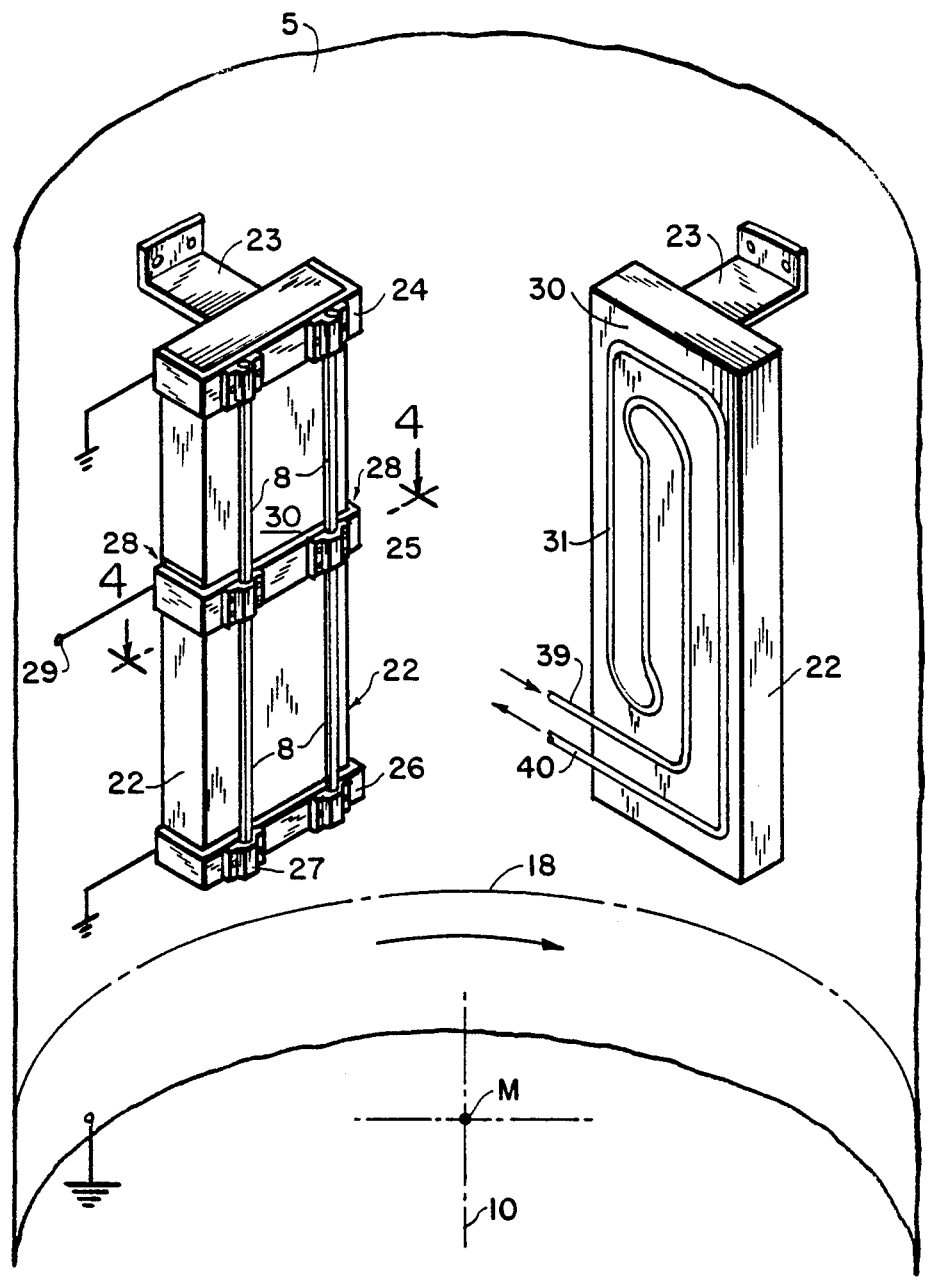
FIG. 3 is a perspective representation of the emitter electrodes (left) disposed each directly opposite the magnetron of FIG. 2, and of the box with the magnet system (right) disposed in back of the emitter electrodes.

In FIG. 3 there is shown a section of the same path of movement 18 as in FIG. 2. The viewing direction is in this case just the opposite, i.e., outwardly from the center M and from the housing axis 10. In this figure can be seen the housing wall 5 to which two rectangular boxes 22 are fastened by brackets 23. In FIG. 3—left—the system is completely mounted: two emitter electrodes 8, which consist of straight tungsten bars, are fastened on the box 22. It can be seen that these emitter electrodes 8 are situated outside of the path of movement 18, namely precisely confronting the magnetrons 6 (FIG. 2). On their course, the substrate mountings 9 must therefore pass between the magnetrons 6 and the positive electrodes 7, on the one hand, and the emitter electrodes 8 on the other.

Considering FIGS. 2 and 3 together, it can be seen furthermore that each of the emitter electrodes 8 is parallel to each of the positive electrodes 7, and that the electrodes in question lie within a plane intersecting these electrodes and radial to the housing axis 10 at the corners of a rectangle, two corners lying on either side of a path of movement for the substrate mounting 9.

For the purpose of fastening the emitter electrodes 8, the box 22 has three contact means 24, 25 and 26 in the form of U-shaped frames with clamping plates 27. The contact means 24 and 26 are conductively connected to the ends of the box 22 and consequently they are at ground potential. The middle contact means 25, however, is fastened to the box 22 by insulators 28, so that a heating voltage of a few volts can be applied to the center of the emitter electrodes 8, so that they can be heated to a sufficiently high emission temperature.

In FIG. 3 it can be seen that the front sides of the boxes 22 can be formed by a flat plate 30. This plate is provided with a cooling means 31 whose configuration is represented on the right in FIG. 3. For the sake of clarity it is not included in the left side of FIG. 3. Also, on the right side of FIG. 3 the emitter electrodes 8 with their contact means 24, 25 and 26, which are actually present, have been omitted, also for the sake of clarity. As it can be seen in FIG. 4, a magnet system 11 consisting of magnets 32 and 33 arranged one inside the other. Magnet 33 is a linear array of a plurality of permanent magnets having all the same polarity, which is indicated in the drawing. The magnets 33 are accompanied by two parallel rows of magnets 32 of the opposite but all the same polarity. The outer magnets 32 are joined at the end by magnets of, again, the same polarity, so that an outer magnetic frame is formed which surrounds at a distance the row of the inner magnets 33. The side of all magnets that faces away from the plate 30 is covered by a pole plate 34 whose contour is congruent with the outer contour of the frame composed by the magnets 32. By this magnetic arrangement, and the fact that the plate 30 is made of a nonmagnetic material, a fully closed tunnel 35 of magnetic lines of force 36 is formed, by which the electrons emitted by the emitter electrodes 8 are guided on a prolonged (spiral) path.

Figure 4:
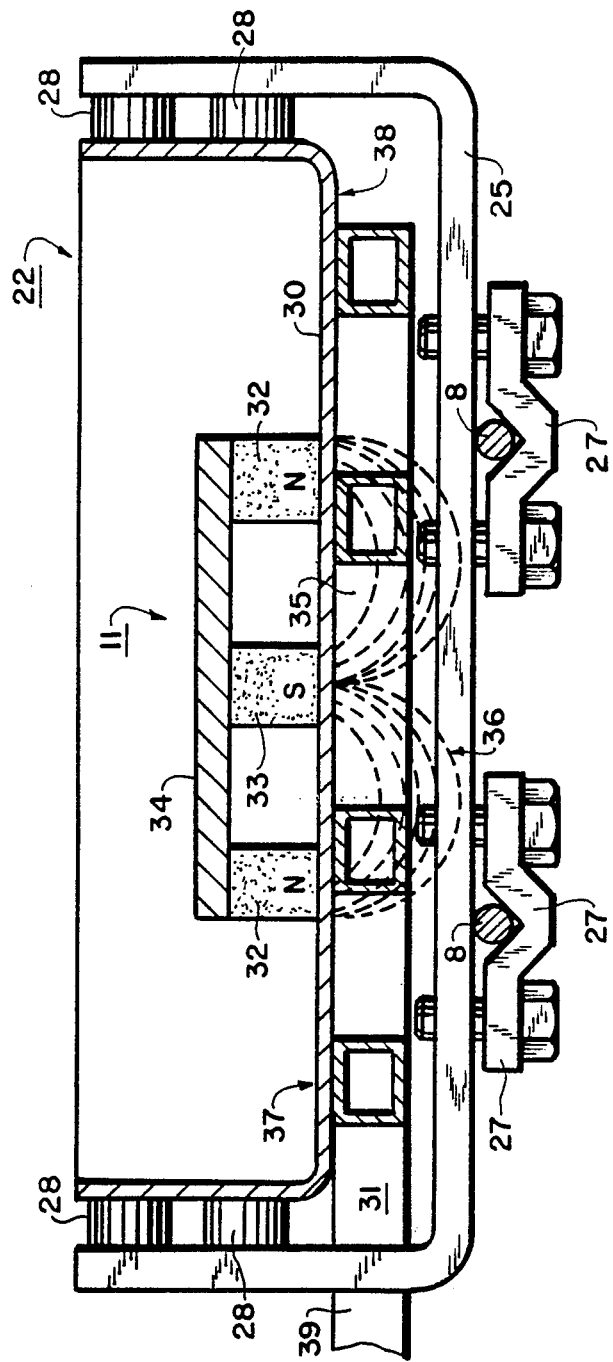
FIG. 4 is a horizontal section through FIG. 3, along the line IV—IV, on an enlarged scale.

As it can be seen in FIG. 4, the magnet system 11 is situated on the back 37 of the plate 30, so that the tunnel 35 forms on the front side 38. On this front side there is also located the cooling means 31 in the form of a sinuous square tube having the terminal ends 39 and 40.

The configuration of the magnetic tunnel 35 corresponds to the configuration of the cavity between the magnets 32 and 33. From this it appears that the two emitter electrodes 8 in the arrangement shown in FIG. 4 are disposed in the immediate vicinity of the tunnel and parallel to plate 30, on the front side of the latter.

We claim:

1. Sputtering apparatus for the reactive coating of substrates with hard substances, especially with titanium nitride or titanium carbide, which has an evacuable housing at ground potential with a feed line for a reaction gas and a noble gas, and in which the sputtering surface of a magnetron serving as sputtering unit as well as at least one mounting for the substrate are disposed, the substrates being positionable in front of the sputtering surface by means of the mounting, characterized in that the mounting for the substrates is disposed in an ionization system with at least two electrodes of which the one electrode is operable as an electron emitter and the other electrode is at positive potential with respect to the emitter electrode, and wherein the substrate mounting itself is at a negative voltage with respect to the ground, and in which at least one magnet system prolonging the path of the electrons leaving the emitter electrode is disposed in the housing, which magnet system is disposed opposite the sputtering surface of the magnetron and the substrate and the electrodes are disposed between the sputtering surface and the magnet system.

2. Sputtering apparatus according to claim 1, characterized in that the at least one positive electrode is on the side of the substrate mounting facing the magnetron.

3. Sputtering apparatus according to claim 2, characterized in that the at least one positive electrode is immediately adjacent the magnetron.

4. Sputtering apparatus according to claim 3, characterized in that, in a magnetron with a rectangular sputtering surface, the positive electrode consists of an electrode pair which is disposed on either side of the magnetron and in each case is disposed in the immediate vicinity of the two longest edges of the sputtering surface.

5. Sputtering apparatus according to claim 1, characterized in that the at least one emitter electrode lies on the side of he substrate mounting that faces away from the magnetron.

6. Sputtering apparatus according to claim 5, characterized in that, in a magnetron with a rectangular sputtering surface, the emitter electrode consists of an electrode pair of which each electrode is parallel to each of the positive electrodes.

7. Sputtering apparatus according to claim 6, characterized in that the electrodes lie within a plane that intersects them and is radial to the housing axis, at the corners of a rectangle, two corners lying in each case on either side of a path of movement for the substrate mounting.

8. Sputtering apparatus according to claim 1, characterized in that the magnet system consists of magnets lying one inside the other, each of opposite polarity, such that a tunnel closed on itself, composed of arcuate magnetic lines of force, issues from the magnets.

9. Sputtering apparatus according to claim 8, characterized in that the magnet system is disposed on the back (37) of a plate consisting of nonmagnetic material, such that the tunnel is on the front side of the plate, and that the at least one emitter electrode is disposed in the immediate vicinity of the tunnel and parallel to the plate on the front side thereof.

10. Sputtering apparatus according to claim 9, characterized in that, in a magnetron with a rectangular sputtering surface, the magnetic tunnel has two parallel long sides to which the emitter electrodes are parallel.

11. Sputtering apparatus according to claim 10, characterized in that the plate is the front side of a rectangular box to whose ends the ends of the emitter electrodes are fastened in an electrically conductive manner, and in whose center a contact means is fastened in an electrically insulated manner, through which a heating voltage can be delivered to the emitter electrodes.

12. Sputtering apparatus according to claim 11, characterized in that the plate is provided with a cooling system.

13. Sputtering apparatus according to claim 1, characterized in that the magnetron is surrounded on its circumference by a frame of a magnetizable material.

* * * * *

UNITED STATES PATENT AND TRADEMARK OFFICE
CERTIFICATE OF CORRECTION

PATENT NO.  : 4,798,663
DATED       : January 17, 1989
INVENTOR(S) : Gunther Herklotz, et al.

It is certified that error appears in the above-identified patent and that said Letters Patent is hereby corrected as shown below:

Column 6, line 5, new claim 5, "he substrate" should be --the substrate--;

Column 6, line 25, new claim 9, delete "37"; and

Abstract, line 4, "a nobble" should be --and a noble--.

Signed and Sealed this

Eighth Day of August, 1989

Attest:

DONALD J. QUIGG

Attesting Officer

Commissioner of Patents and Trademarks